(12) United States Patent
Kuo et al.

(10) Patent No.: US 9,240,401 B2
(45) Date of Patent: Jan. 19, 2016

(54) SEMICONDUCTOR DEVICE AND METHOD OF MANUFACTURING A SEMICONDUCTOR DEVICE

(71) Applicant: Taiwan Semiconductor Manufacturing Company, Ltd., Hsin-Chu (TW)

(72) Inventors: Hsi-Yu Kuo, Hsin-Chu (TW); Chin-Yuan Ko, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/446,522

(22) Filed: Jul. 30, 2014

(65) Prior Publication Data

US 2014/0339603 A1 Nov. 20, 2014

Related U.S. Application Data

(63) Continuation-in-part of application No. 13/763,374, filed on Feb. 8, 2013.

(51) Int. Cl.
*H01L 29/66* (2006.01)
*H01L 27/02* (2006.01)

(52) U.S. Cl.
CPC .................................. *H01L 27/0262* (2013.01)

(58) Field of Classification Search
CPC ............ H01L 21/8249; H01L 27/0255; H01L 27/0259

See application file for complete search history.

(56) References Cited

U.S. PATENT DOCUMENTS

| | | | |
|---|---|---|---|
| 4,652,895 A | 3/1987 | Roskos | |
| 5,212,398 A * | 5/1993 | Matsunaga et al. | 257/356 |
| 2006/0043489 A1 * | 3/2006 | Chen | H01L 27/0255 257/355 |
| 2009/0108406 A1 | 4/2009 | Sato | |
| 2011/0248383 A1 * | 10/2011 | Ren et al. | 257/577 |
| 2013/0082353 A1 | 4/2013 | Kuo et al. | |

* cited by examiner

*Primary Examiner* — Jerome Jackson, Jr.
*Assistant Examiner* — Fang-Xing Jiang
(74) *Attorney, Agent, or Firm* — Slater & Matsil, L.L.P.

(57) ABSTRACT

Semiconductor devices and methods of manufacture thereof are disclosed. In some embodiments, a semiconductor device includes: a substrate; a first region over the substrate; a second region laterally adjacent to the first region; a third region disposed laterally adjacent to the second region on a side of the second region opposite the first region; a fourth region disposed within a portion of the first region proximate the second region; a fifth region disposed within a portion of the second region proximate the first region, wherein the fourth region and the fifth region are separated by a first isolation area; a sixth region disposed within a portion of the third region proximate the second region; and a seventh region disposed within the second region and below the fifth region.

20 Claims, 17 Drawing Sheets

SEMICONDUCTOR DEVICE AND METHOD OF MANUFACTURING A SEMICONDUCTOR DEVICE

PRIORITY CLAIM AND CROSS-REFERENCE

This application is a continuation-in-part of U.S. patent application Ser. No. 13/763,374, filed on Feb. 8, 2013, entitled "Methods and Apparatus for ESD Protection Circuits," which application is hereby incorporated herein by reference.

BACKGROUND

Electrostatic discharge (ESD) is the sudden flow of electricity between two objects caused by a contact, an electrical short, or a dielectric breakdown. ESD can be caused by a buildup of static electricity by tribocharging, or by electrostatic induction. ESD includes spectacular electric sparks, but also less dramatic forms which may be neither seen nor heard, yet large enough to cause damage to sensitive electronic devices. ESD can cause a range of harmful effects, as well as failure of an integrated circuit (IC).

An electrostatic discharge ("ESD") protection circuit may be needed for the IC. The ESD protection circuit provides a path to bypass current from a terminal of the IC to a ground or from the terminal of the IC to a power supply rail, so that the current due to an ESD event can bypass the internal circuitry of the IC. Voltages far in excess of the normal operating voltages, in both positive and negative magnitudes, are observed during short duration electrostatic discharge events. Therefore, the ESD protection circuit prevents the ESD current from destroying sensitive components in the IC.

The ESD protection circuit can be triggered or activated in response to a trigger voltage over a threshold. Snapback devices such as silicon controlled rectifier (SCR) circuits and bipolar junction transistors (BJTs) may be used as ESD protection circuits. However, an SCR circuit has potential burn out risks caused by mistakenly triggered ESD events since the trigger voltage of an SCR circuit may change when ESD events generate waveforms having different rising times.

After triggering or activating the ESD protection circuit, the ESD protection circuit remains active as long as a voltage is over a "holding voltage." If the "holding voltage" of the ESD protection circuit is too low, the ESD protection circuit may likely stay active when the IC is no longer under ESD stress. Accordingly high holding voltages for ESD protection circuits are desirable. The holding voltage of a snapback device including at least one SCR circuit an at least one BJT may be determined by the holding voltage of the SCR circuit. The holding voltage of the SCR circuit is low in most cases, thus leading to a snapback device with a low holding voltage. The low holding voltage leads to large gap between the trigger voltage and the holding voltage of these snapback devices. Improved ESD protection circuits are needed with high holding voltages, and reduced gap between the trigger voltage and the holding voltage, which is more suitable for high voltage applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
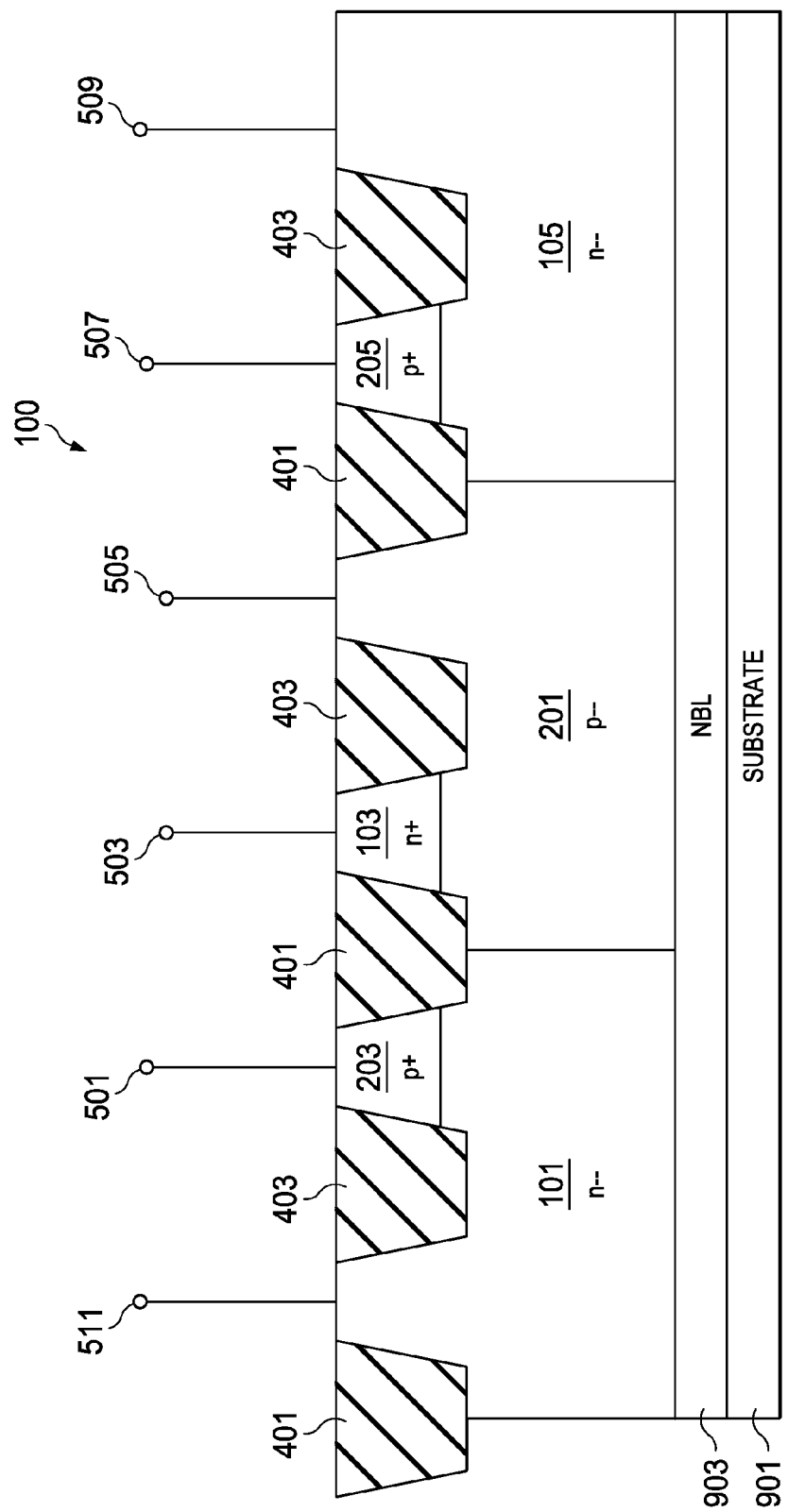
FIG. 1(a) to FIG. 5 illustrate ESD protection circuits, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1(a) illustrates in a cross sectional view an embodiment of an ESD protection circuit 100. Semiconductor manufacturing processes that may be used to form the ESD protection circuit 100 include photolithography, wet and dry etching, plasma etching, ashing, chemical vapor deposition, plasma vapor deposition, plasma enhanced chemical vapor deposition, electroless plating and electroplating, silicidation, oxide deposition including thermal oxidation, tetraethoxysilane (TEOS), spun on glass and other oxide and nitride depositions, planarization processes such as chemical mechanical planarization (CMP), forming isolation regions using trenches or local oxidation of silicon (LOCOS) and the like.

In FIG. 1(a), a portion of a semiconductor substrate 201 is shown. The semiconductor substrate 201 may be a p type doped substrate, or an n type doped substrate, which means that the semiconductor substrate 201 may be doped with either n type or p type impurities or dopants. The semiconductor substrate 201 may include, or may consist of, silicon, gallium arsenide, silicon germanium or other semiconductor materials used in semiconductor device processing. Although in the illustrated examples presented herein for explanation a semiconductor substrate is used, in other alternative embodiments epitaxially grown semiconductor materials or a silicon on insulator (SOI) layer may be used as the semiconductor substrate 201.

Dopant impurities can be implanted into a semiconductor material to form a p type or an n type material. A p type material may be further classified as p++, p+, p, p−, p−−, type materials, depending on the concentration of the dopant. If a material is stated to be a p type material, it is doped with p type impurities and it may be any of the p++, p+, p, p−, p−−, type materials. Similarly, an n type material may be further classified as n++, n+, n, n−, n−− type materials. If a material is stated to be an n type material, it is doped with n type impurities and it may be any of the n++, n+, n, n−, n−− type materials. Dopant atoms for p type materials include boron, for example. In n type materials, dopant atoms include phosphorous, arsenic, and antimony, for example. Doping may be done by ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allow for in-situ doping during the epitaxial processes. Implantation can be done through certain materials, such as thin oxide layers.

The doping concentration amounts for the well region and the diffusions described may vary with the process used and the particular design. Doping concentrations of a p type material or an n type material may range from about $1 \times 10^{14}$ atoms/cm$^3$ to about $1 \times 10^{22}$ atoms/cm$^3$, and doping concentrations of a p+/n+ material may be greater than about $1 \times 10^{18}$ atoms/cm$^3$, for example. Some other ranges of doping concentrations may be used, such as a n−−/p−− material with a doping concentration less than about $1 \times 10^{14}$ atoms/cm$^3$, a n−/p− material with a doping concentration ranging from about $1 \times 10^{14}$ atoms/cm$^3$ to about $1 \times 10^{16}$ atoms/cm$^3$, a n/p material with a doping concentration ranging from about $1 \times 10^{16}$ atoms/cm$^3$ to about $1 \times 10^{18}$ atoms/cm$^3$, a n+/p+ material with a doping concentration ranging from about $1 \times 10^{18}$ atoms/cm$^3$ to about $1 \times 10^{20}$ atoms/cm$^3$, and a n++/p++ material with a doping concentration ranging larger than about $1 \times 10^{20}$ atoms/cm$^3$. Further alternative ranges of concentrations may be used, such as a n−−/p−− material with a doping concentration in a range from about $1 \times 10^{15}$ atoms/cm$^3$ to about $1 \times 10^{18}$ atoms/cm$^3$, and a n−/p− material with a doping concentration about 5 to about 100 times greater than the concentration of a n−−/p−− material.

As shown in FIG. 1(a), the ESD protection circuit 100 may include a first region 101, a second region 201, and a third region 105 disposed over the semiconductor substrate 901. The ESD protection circuit 100 may further include an n type barrier layer (NBL) 903 underlying the first region 101, second region 201, and third region 105. The NBL 903 may be disposed over the semiconductor substrate 901, as shown in the example of FIG. 1(a). The first region 101 may include, or may consist of, a first n type material. In the embodiment shown in FIG. 1(a), the material of the first region 101 is shown as an n−− type material. However, it is understood that any other n type material may be used. For example, the first region 107 may include, or may consist of, an n− type, n type, n+ type, or n++ type material. These embodiments are not shown for the sake of simplicity and brevity.

The second region 201 may be disposed laterally adjacent to the first region 101 and may include, or may consist of, a first p type material. In the embodiment shown in FIG. 1(a), a sidewall of the second region 201 faces a sidewall of the first region 101 and is in contact (e.g. physical contact, e.g. direct physical contact) with the sidewall of the first region 101. The material of the second region 201 in the example of FIG. 1(a) is shown as a p−− type material. However, it is understood that any other p type material may be used. For example, in other embodiments, the second region 201 may include, or may consist of, a p− type, p type, p+ type, or p++ type material. These embodiments are not shown for the sake of simplicity and brevity.

The third region 105 may be disposed laterally adjacent to the second region 201, e.g. on a side of the second region 201 opposite the first region 101. In other words, the second region 201 may be disposed between the first region 101 and the third region 105. The third region 105 may include, or may consist of, a second n type material. In the embodiment shown in FIG. 1(a), a sidewall of the third region 105 faces and is in contact (e.g. physical contact, e.g. direct physical contact) with a sidewall of the second region 201. The material of the third region 105 in the example of FIG. 1(a) is shown as an n−− type material. However, it is understood that any other n type material may be used. For example, in other embodiments, the third region 105 may include, or may consist of, an n− type, n type, n+ type, or n++ type material. These embodiments are not shown for the sake of simplicity and brevity.

The ESD protection circuit 100 may include a plurality of first isolation areas 401, which may be disposed between the respective regions of the ESD protection circuit 100. For example, in the embodiment of FIG. 1(a), a first one of the plurality of first isolation areas 401 may be disposed at a boundary between the first region 101 and the second region 201. The first one of the plurality of first isolation areas 401 may extend laterally into a portion of the first region 101 and into a portion of the second region 201. Furthermore, the first one of the plurality of the first isolation areas 401 may be disposed at or near surfaces of the first region 101 and the second region 201 facing away from the semiconductor substrate 901. By way of another example, a second one of the plurality of first isolation areas 401 may be disposed at a boundary between the second region 201 and the third region 105. The second one of the plurality of first isolation areas 401 may extend laterally into a portion of the second region 201 and into a portion of the third region 105. The second one of the plurality of the first isolation areas 401 may be disposed at or near surfaces of the second region 101 and the third region 105 facing away from the semiconductor substrate 901. Also shown in the example of FIG. 1(a) is a third one of the plurality of first isolation areas 401 disposed at a boundary of the first region 101 on a side of the first region 101 opposite the second region 201.

The ESD protection circuit 100 may include a plurality of second isolation areas 403, which may be formed within each of the respective regions (e.g. within the first region 101, the second region 201, and the third region 105). For example, a first one of the plurality of second isolation areas 403 may be formed within the first region 101, as shown in the example of FIG. 1(a). The first one of the plurality of the second isolation areas 403 may be disposed at or near a surface of the first region 101 facing away from the semiconductor substrate 901. Also shown in the embodiment of FIG. 1(a) is a second one and a third one of the plurality of second isolation areas 403, which may be formed within the second region 201 and the third region 105, respectively. The second one and the third one of the plurality of the second isolation areas 403 may be disposed at or near surfaces of the second region 201 and the third region 105 facing away from the semiconductor substrate 901. The plurality of first isolation areas 401 and/or the plurality of second isolation areas 403 may be formed, for example, using shallow trench isolation (STI), where an oxide, nitride or similar dielectric is formed in a trench region. Alternative embodiments include local oxidation of silicon (LOCOS) isolation, or any other form of isolations.

The ESD protection circuit 100 may include a fourth region 203 disposed within a portion of the first region 101. For example, the fourth region 203 may be disposed at or near a surface of the first region 101 facing away from the semiconductor substrate 901, as shown in FIG. 1(a). The fourth region 203 may additionally be disposed between one of the plurality of first isolation areas 401 proximate the second region 201 (e.g. the first one of the plurality of first isolation areas 401) and one of the plurality of second isolation areas 403 within the first region 101 (e.g. the first one of the plurality of second isolation areas 403).

The fourth region 203 may include, or may consist of, a second p type material. The material of the fourth region 203 in the example of FIG. 1(a) is shown as a p+ type material. However, it is understood that any other p type material may be used. For example, in other embodiments, the fourth region 203 may include, or may consist of, a p−− type, p− type, p type, or p++ type material. These embodiments are not shown for the sake of simplicity and brevity.

The ESD protection circuit 100 may include a fifth region 103 disposed within a portion of the second region 201. For example, the fifth region 103 may be disposed at or near a surface of the second region 201 facing away from the semiconductor substrate 901, as shown in FIG. 1(a). The fifth region 103 may additionally be disposed between one of the plurality of first isolation areas 401 proximate the first region 101 (e.g. the first one of the plurality of first isolation areas 401) and one of the plurality of second isolation areas 403 within the second region 201 (e.g. the second one of the plurality of second isolation areas 403).

The fifth region 103 may include, or may consist of, a third n type material. The material of the fifth region 103 in the example of FIG. 1(a) is shown as an n+ type material. However, it is understood that any other n type material may be used. For example, in other embodiments, the fifth region 103 may include, or may consist of, an n−− type, n− type, n type, or n++ type material. These embodiments are not shown for the sake of simplicity and brevity.

The ESD protection circuit 100 may include a sixth region 205 disposed within a portion of the third region 105. For example, the sixth region 205 may be disposed at or near a surface of the third region 105 facing away from the semiconductor substrate 901, as shown in FIG. 1(a). The sixth region 205 may be disposed between one of the plurality of first isolation areas 401 proximate the second region 201 (e.g. the second one of the plurality of first isolation areas 401) and one of the plurality of second isolation areas 401 within the third region 105 (e.g. the third one of the plurality of second isolation areas 403).

The sixth region 205 may include, or may consist of, a third p type material. The material of the sixth region 205 in the example of FIG. 1(a) is shown as a p+ type material. However, it is understood that any other p type material may be used. For example, in other embodiments, the sixth region 205 may include, or may consist of, a p−− type, p− type, p type, or p++ type material. These embodiments are not shown for the sake of simplicity and brevity.

As shown in FIG. 1(a), the ESD protection circuit 100 may include a first contact 511, a second contact 501, a third contact 503, a fourth contact 505, a fifth contact 507, and a sixth contact 509. The first contact 511 may be electrically connected (e.g. via a direct physical connection) to the first region 101. The second contact 501 may be electrically connected (e.g. via a direct physical connection) to the fourth region 203. The third contact 503 may be electrically connected (e.g. via a direct physical connection) to the fifth region 103. The fourth contact 505 may be electrically connected (e.g. via a direct physical connection) to the second region 201. The fifth contact 507 may be electrically connected (e.g. via a direct physical connection) to the sixth region 205. The sixth contact 509 may be electrically connected (e.g. via a direct physical connection) to the third region 105.

Figure 1B:
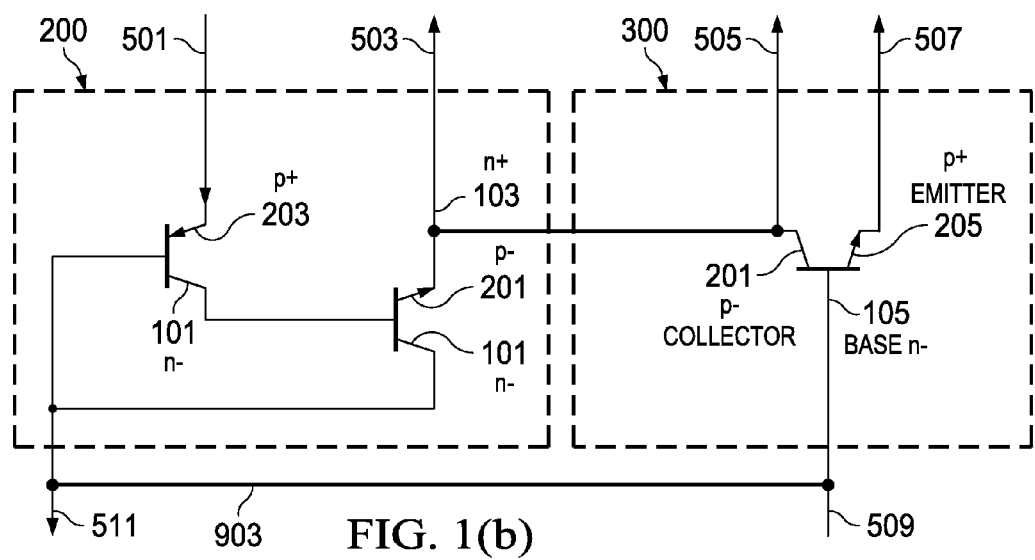

In the ESD protection circuit 100, the fourth region 203, the first region 101, the second region 201, and the fifth region 103 may form a PNPN structure of a silicon controlled rectifier (SCR) circuit 200, as shown in FIG. 1(b) in a circuit schematic diagram. The fourth region 203 may be identified as a first P node of the SCR circuit 200, and the first region 101 may be identified as a first N node of the SCR circuit 200. Similarly, the second region 201 may be identified as a second P node of the SCR circuit 200, and the fifth region 103 (including, or consisting of, an n type material) may be identified as a second N node of the SCR circuit 200. Consequently, as shown in the circuit diagram of FIG. 1(b), the first contact 511, the second contact 501, and the third contact 503 may be connected to the first N node, the first P node, and the second N node of the SCR circuit 200, respectively.

In the ESD protection circuit 100, the second region 201, the third region 105, and the sixth region 205 may form a PNP circuit 300, as shown in FIG. 1(b). The third region 105, the second region 201, and the sixth region 205 may be identified as a base, a collector, and an emitter of the PNP circuit 300. Accordingly, the second region 201 acts as both the collector of the PNP circuit 300 and the second P node of the SCR circuit 200. Furthermore, the third region 105 and the first region 101 are connected to each other by the NBL 903 as shown in FIG. 1(a) and FIG. 1(b).

As illustrated in FIG. 1(a), the NBL 903 is disposed over the semiconductor substrate 901 and beneath the first region 101, the second region 201, and the third region 105. Besides connecting (e.g. electrically connecting) the third region 105 and the first region 101 to each other, the NBL 903 may also serve as a barrier against the movement of electrons and holes of a semiconductor. The NBL 903 may be formed as a deep n type well, for example. Since the first N node of the SCR circuit 200 (e.g. the first region 101) is connected to the base of the PNP circuit 300 (e.g. the third region 105) by the NBL 903, mistakenly triggered ESD events in the ESD protection circuit 100 can be avoided or substantially reduced. This may, at least in part, be due to the trigger voltage of the ESD protection circuit 100 being tied to the trigger voltage of the PNP circuit 300, and not to the trigger voltage of the SCR circuit 200. Therefore, the trigger of the ESD protection circuit 100 may be unaffected by ESD waveforms with different rising times, even if the trigger voltage of the SCR circuit 200 varies with these different rising times. This in turn can avoid potential burn out risks for the ESD protection circuit 100.

Figure 2A:
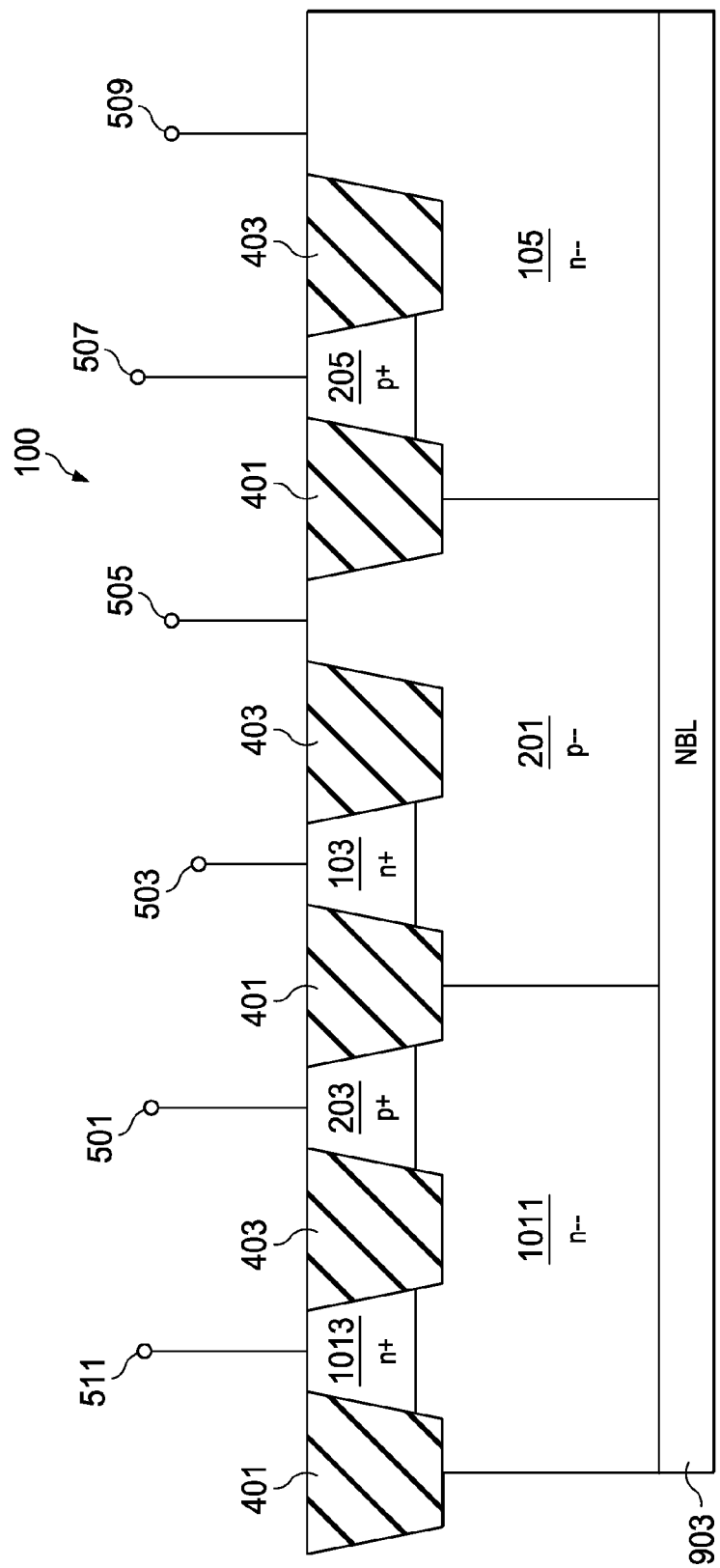
Figure 2B:
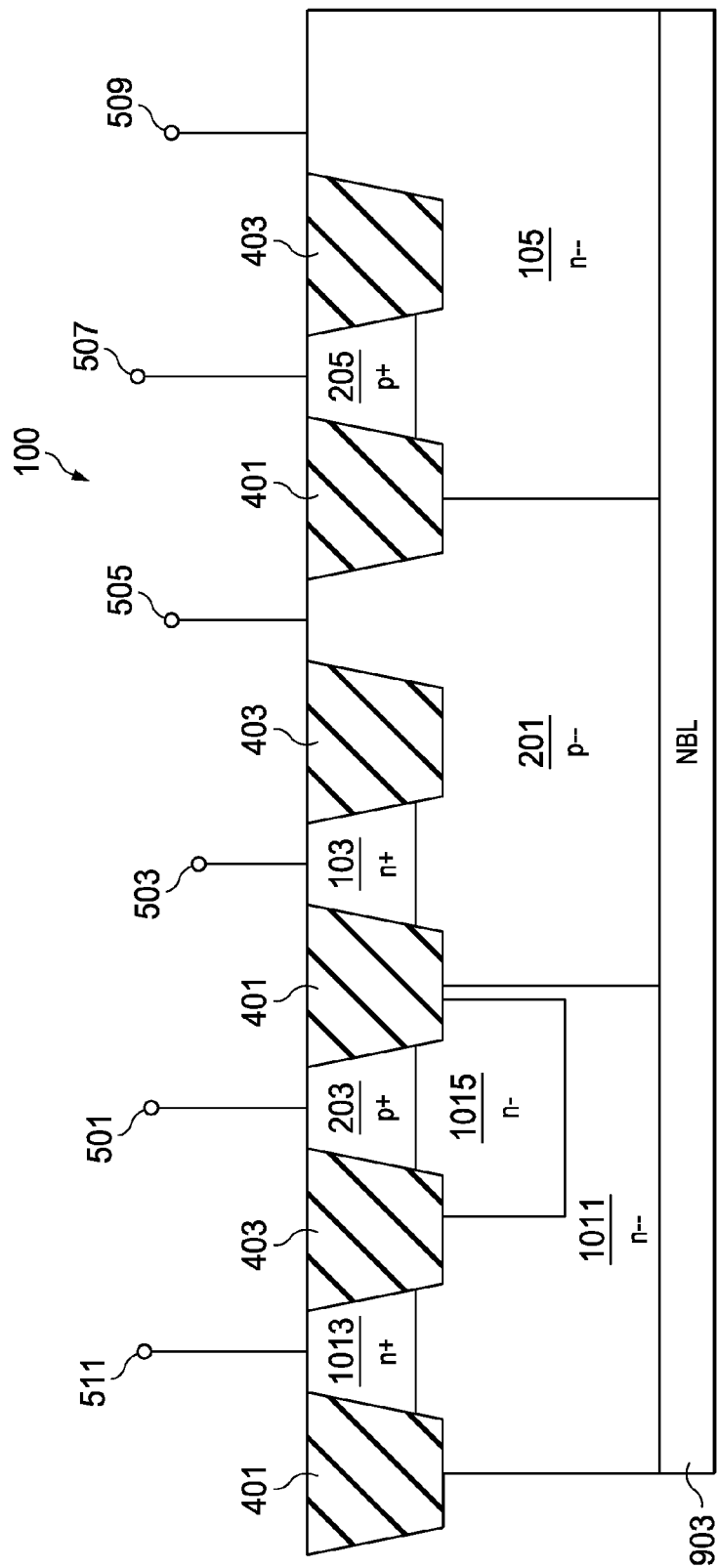

FIGS. 2(a)-2(b) illustrate in cross sectional views additional embodiments of ESD protection circuits, where the first region 101 includes multiple parts (e.g. two or more parts) with different n type materials. For example, as shown in FIG. 2(a), the first region 101 may include a first part 1011 and a second part 1013. The first part 1011 and the second part 1013 may both include n type materials, although the n type material of the first part 1011 and the n type material of the second part 1013 may be different n type materials and/or have different doping concentrations. For example, in the embodiment shown in FIG. 2(a), the first part 1011 may include, or may consist of, an n type material shown as an n−− type material, and the second part 1013 may include, or may consist of, another n type material shown as an n+ type material. Both the first part 1011 and the second part 1013 of the first region 101 function together as the first N node of the SCR circuit 200. Any other n type material may be used for the first part 1011 and the second part 1013 of the first region 101.

The second part 1013 of the first region 101 may be disposed over a portion of the first part 1011 of the first region 101. For example, the second part 1013 of the first region 101 may be disposed at or near a surface of the first region 101 facing away from the semiconductor substrate 901. As shown in FIG. 2(*a*), the second part 1013 may be disposed laterally adjacent to the fourth region 203 and may be separated from the fourth region 203 by an isolation area (e.g. the first one of the plurality of second isolation areas 403). Additionally, the second part 1013 may be disposed between adjacent isolation areas (e.g. between the third one of the plurality of first isolation areas 401 and the first one of the plurality of second isolation areas 403).

Alternatively, as shown in FIG. 2(*b*), the first region 101 may include the first part 1011, the second part 1013, and a third part 1015 (including, or consisting of, yet another n type material shown as an n− type material). The first part 1011, the second part 1013, and the third part 1015 function together as the first N node of the SCR circuit 200. Any other type of n material may be used for any of the first part 1011, the second part 1013, and the third part 1015 of the first region 101.

In the embodiment shown in FIG. 2(*b*), the third part 1015 may be disposed below the fourth region 403. Furthermore, a first boundary of the third part 1015 (e.g. the left boundary) may be disposed below one of the plurality of second isolation areas 403 within the first region 101 (e.g. below the first one of the plurality of second isolation areas 403). A second boundary of the third part 1015 opposite the first boundary (e.g. the right boundary) may be disposed below one of the plurality of first isolation areas 401 (e.g. below the first one of the plurality of first isolation areas 401). The second boundary of the third part 1015 may be spaced apart from the boundary between the second region 201 and the first region 101, as shown in FIG. 2(*b*).

Figure 3A:
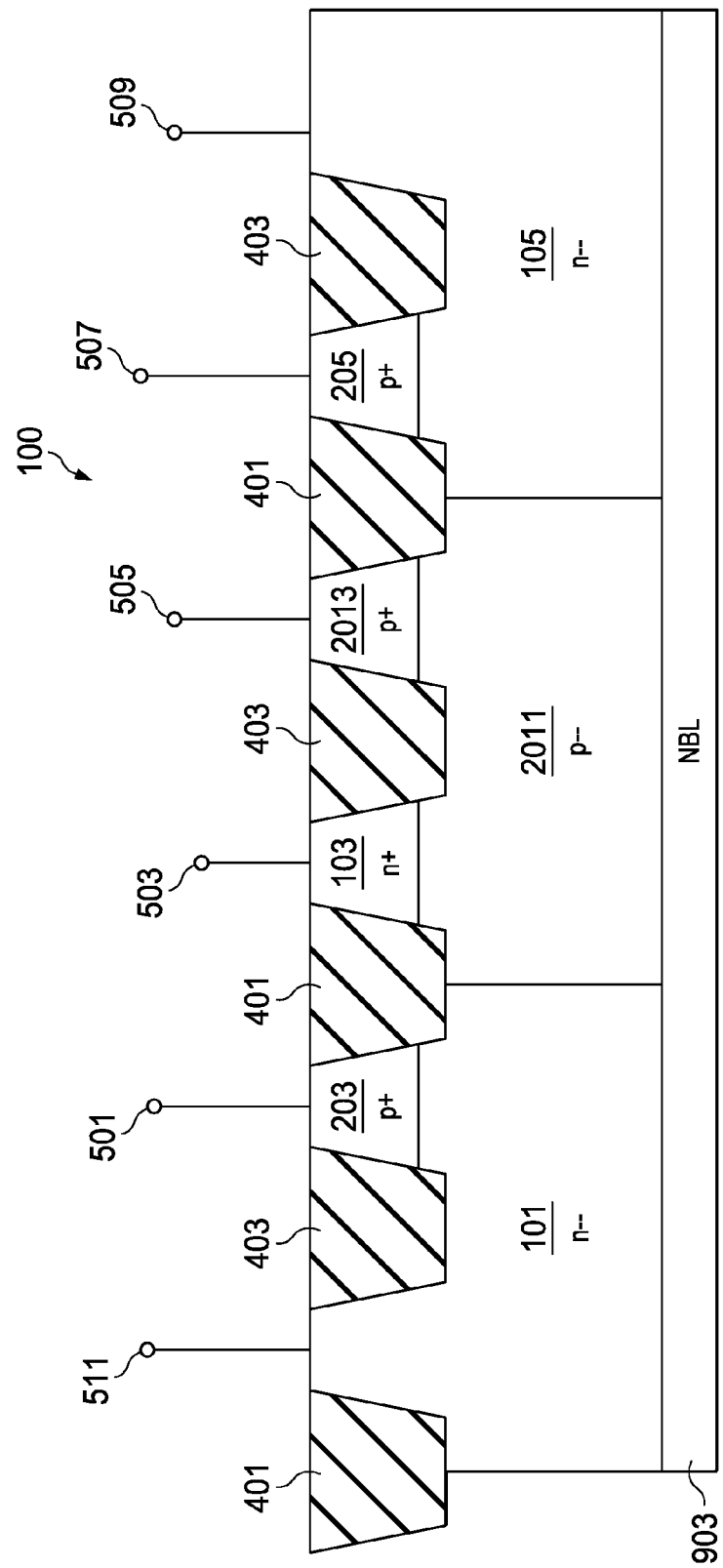
Figure 3B:
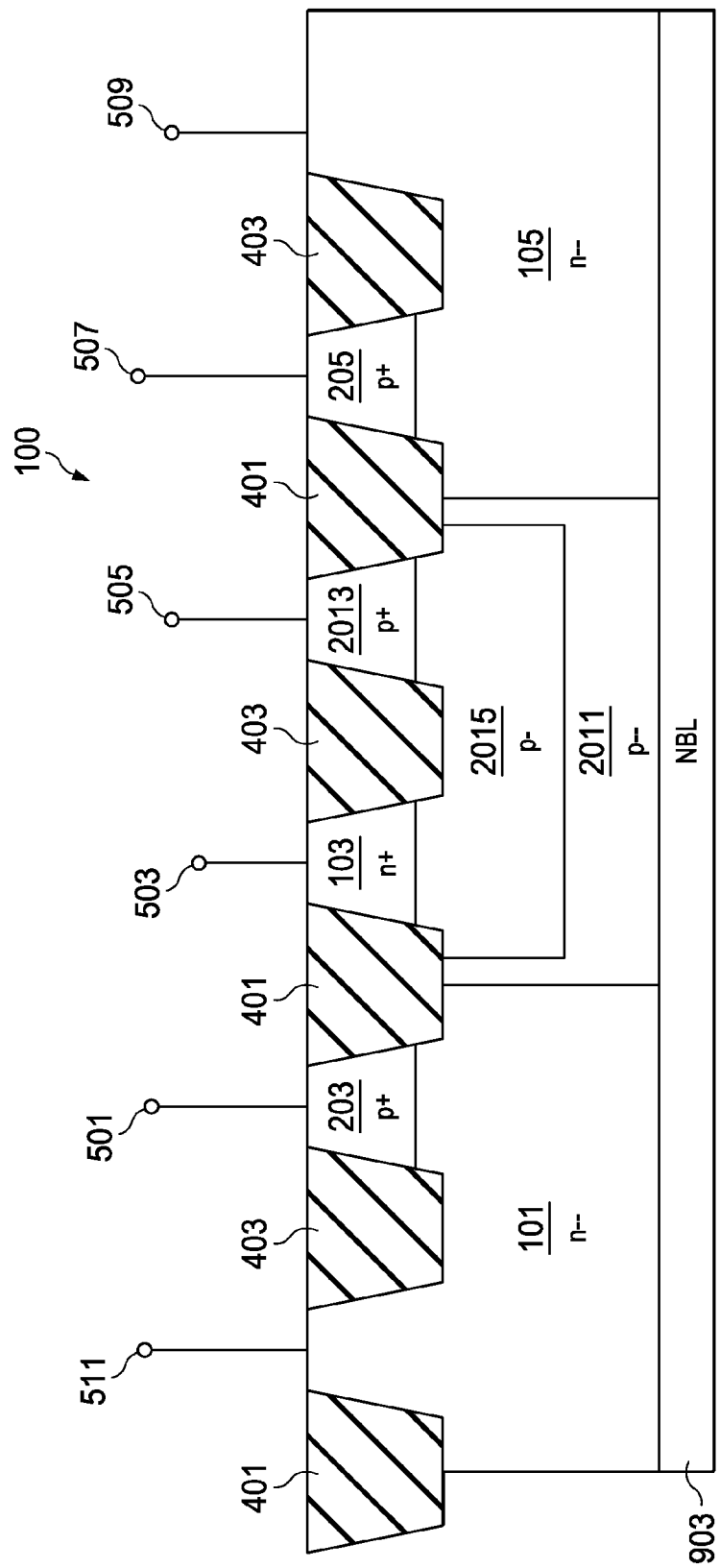

FIGS. 3(*a*)-3(*b*) illustrate in cross sectional views additional embodiments of ESD protection circuits, where the second region 201 may include multiple parts (e.g. two or more parts) with different p type materials. For example, as shown in FIG. 3(*a*), the second region 201 may include a first part 2011 and a second part 2013. The first part 2011 and the second part 2013 may both include p type materials, although the p type material of the first part 2011 and the p type material of the second part 2013 may be different p type materials and/or have different doping concentrations. For example, in the embodiment shown in FIG. 3(*a*), the first part 2011 may include, or may consist of, a p type material shown as a p−− type material and the second part 2013 may include, or may consist of, another p type material shown as a p+ type material. Both the first part 2011 and the second part 2013 of the second region 201 function together as the second P node of the lateral SCR circuit 200. Any other p type material may be used for the first part 2011 and the second part 2013 of the second region 201.

The second part 2013 of the second region 201 may be disposed over a portion of the first part 2011 of the second region 201. For example, the second part 2013 of the second region 201 may be disposed at or near a surface of the second region 201 facing away from the semiconductor substrate 901. As shown in FIG. 3(*a*), the second part 2013 may be disposed laterally adjacent to the fifth region 103 and may be separated from the fifth region 103 by an isolation area (e.g. the second one of the plurality of second isolation areas 403). Additionally, the second part 2013 may be disposed between adjacent isolation areas (e.g. between the second one of the plurality of first isolation areas 401 and the second one of the plurality of second isolation areas 403).

Alternatively, as shown in FIG. 3(*b*), the second region 201 may include the first part 2011, the second part 2013, and a third part 2015 (including, or consisting of, yet another p type material shown as a p− type material). The first part 2011, the second part 2013, and the third part 2015 function together as the second P node for the lateral SCR circuit 200 and the collector for the lateral PNP circuit 300. Any other type of p material may be used for any of the first part 2011, the second part 2013, and the third part 2015 of the second region 201.

In the embodiment shown in FIG. 3(*b*), the third part 2015 may be disposed below the fifth region 103 and the second part 2013 of the second region 201. The third part 2015 may further be disposed below the isolation area between the fifth region 103 and the second part 2013 (e.g. below the second one of the plurality of second isolation areas 403). In other words, the fifth region 103, the second part 2013 of the second region 201, and the isolation area therebetween may be within a lateral extent of the third part 2015 of the second region 201, as shown in FIG. 3(*b*). Furthermore, a first boundary (e.g. left boundary) and a second boundary (e.g. right boundary) of the third part 2015 may be disposed below the plurality of first isolation areas 401 (e.g. below the first one and the second one of the plurality of first isolation areas 401). The first boundary of the third part 2015 may be spaced apart from the boundary between the second region 201 and the first region 101, as shown in FIG. 3(*b*). Furthermore, the second boundary of the third part 2015 may be spaced apart from the boundary between the second region 201 and the third region 105, as shown in FIG. 3(*b*).

Figure 4A:
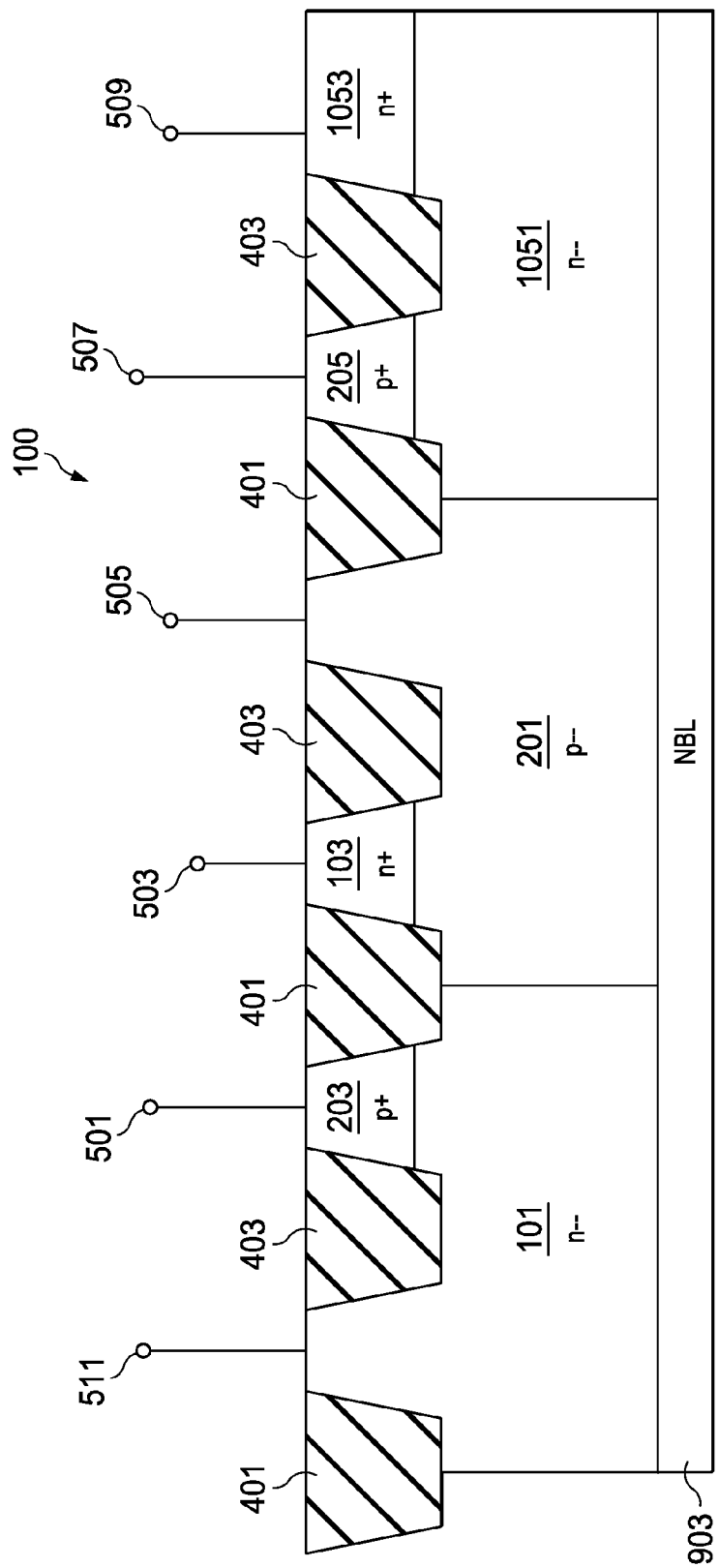
Figure 4B:
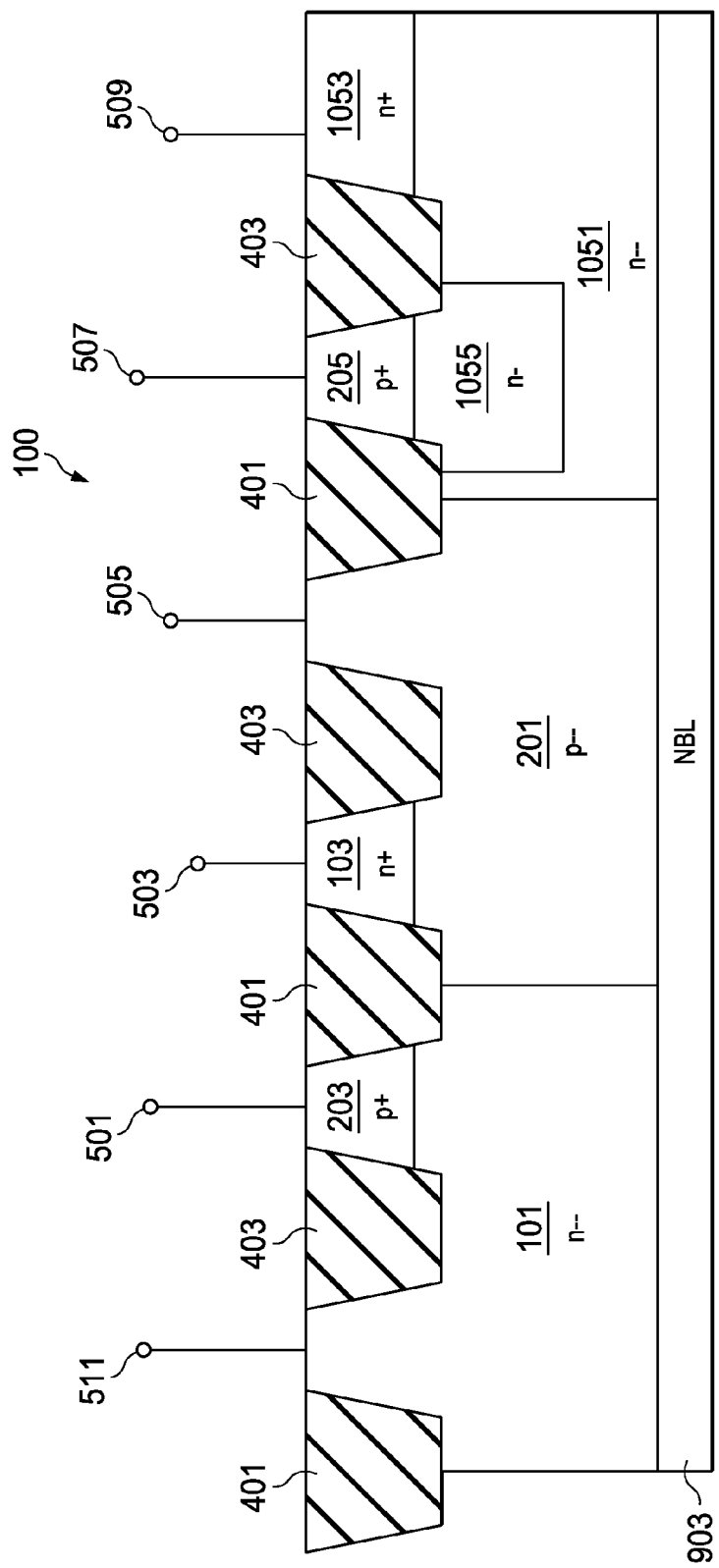

FIGS. 4(*a*)-4(*b*) illustrate in cross sectional views additional embodiments of ESD protection circuits, where the third region 105 may include multiple parts (e.g. two or more parts) with different n type materials. For example, as shown in FIG. 4(*a*), the third region 105 may include a first part 1051 and a second part 1053. The first part 1051 and the second part 1053 may both include n type materials, although the n type material of the first part 1051 and the n type material of the second part 1053 may be different n type materials and/or have different doping concentrations. For example, in the embodiment shown in FIG. 4(*a*), the first part 1051 may include, or may consist of, one n type material shown as an n−− type material and the second part 1053 may include, or may consist of, another n type material shown as an n+ type material. Both the first part 1051 and the second part 1053 of the third region 105 function together as the base of the PNP circuit 300. Any other n type material may be used for the first part 1051 and the second part 1053 of the third region 105.

The second part 1053 of the third region 105 may be disposed over a portion of the first part 1051 of the third region 105. For example, the second part 1053 of the third region 105 may be disposed at or near a surface of the third region 105 facing away from the semiconductor substrate 901. As shown in FIG. 4(*a*), the second part 1053 may be disposed laterally adjacent to the sixth region 205 and may be separated from the sixth region 205 by an isolation area (e.g. the third one of the plurality of second isolation areas 403).

Alternatively, as shown in FIG. 4(*b*), the third region 105 may include the first part 1051, the second part 1053, and a third part 1055 (including, or consisting of, yet another n type material shown as an n− type material). The first part 1051, the second part 1053, and the third part 1055 function together as the base of the lateral PNP circuit 300. Any other type of n material may be used for any of the first part 1051, the second part 1053, and the third part 1055 of the third region 105.

In the embodiment shown in FIG. 4(*b*), the third part 1055 may be disposed below the sixth region 205. Furthermore, a first boundary (e.g. a left boundary) and a second boundary (e.g. a right boundary) of the third part 1055 may be disposed below isolation areas (e.g. below the second one of the plurality of first isolation areas 401 and below the third one of the plurality of second isolation areas 403). The first boundary of the third part 1055 may be spaced apart from the boundary between the second region 201 and the third region 105, as shown in FIG. 4(*b*).

Various embodiments of the first region 101 (e.g. shown in FIGS. 2(*a*)-2(*b*)), various embodiments of the second region 201 (e.g. shown in FIGS. 3(*a*)-3(*b*)), and various embodiments of the third region 105 (e.g. shown in FIGS. 4(*a*)-4(*b*)) may be combined together to provide other embodiments of the ESD protection circuit 100. For example, as shown in FIG. 5, the first region 101 shown in FIG. 2(*b*), the second region 201 shown in FIG. 3(*b*), and the third region 105 shown in FIG. 4(*b*) may be combined to provide an embodiment of the ESD protection circuit 100.

Figure 5:
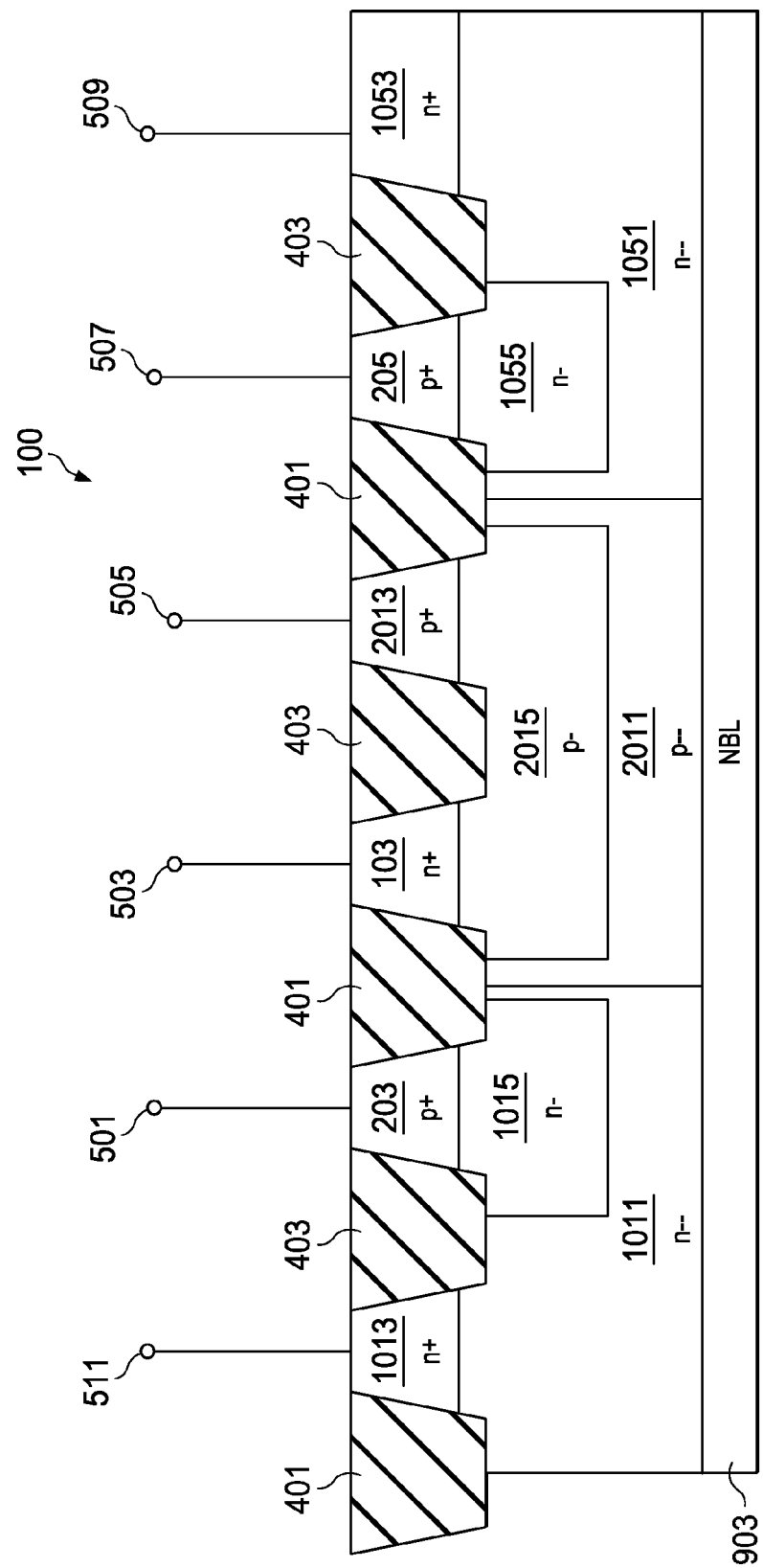

While the potential burn out risks caused by mistakenly triggered ESD events are avoided or substantially reduced in the embodiments shown in FIG. 1(*a*) to FIG. 5, the holding voltage of these embodiments of the ESD protection circuit 100 may be low, due, at least in part, to the low holding voltage of the SCR circuit 200. This leads to a large gap between the trigger voltage of the ESD protection circuit 100 and the holding voltage of the ESD protection circuit 100. Accordingly, the ESD protection circuits shown in FIG. 1(*a*) to FIG. 5 may stay active when an IC is no longer under ESD stress.

Figure 6A:
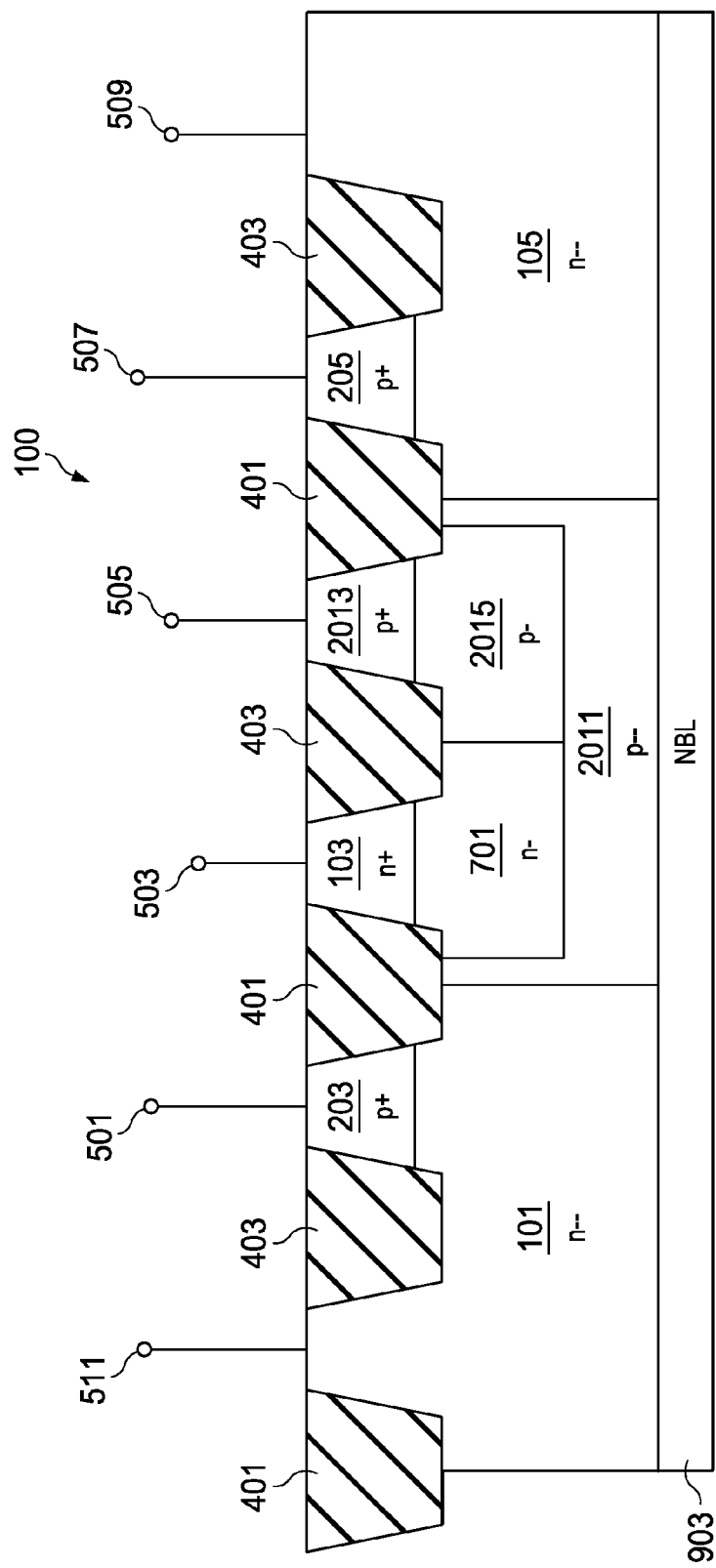
FIGS. 6(a), 6(b), 7(a), 7(b), and 7(c) illustrate in cross sectional views and a circuit diagram additional embodiments of ESD protection circuits including a seventh region.
Figure 6B:
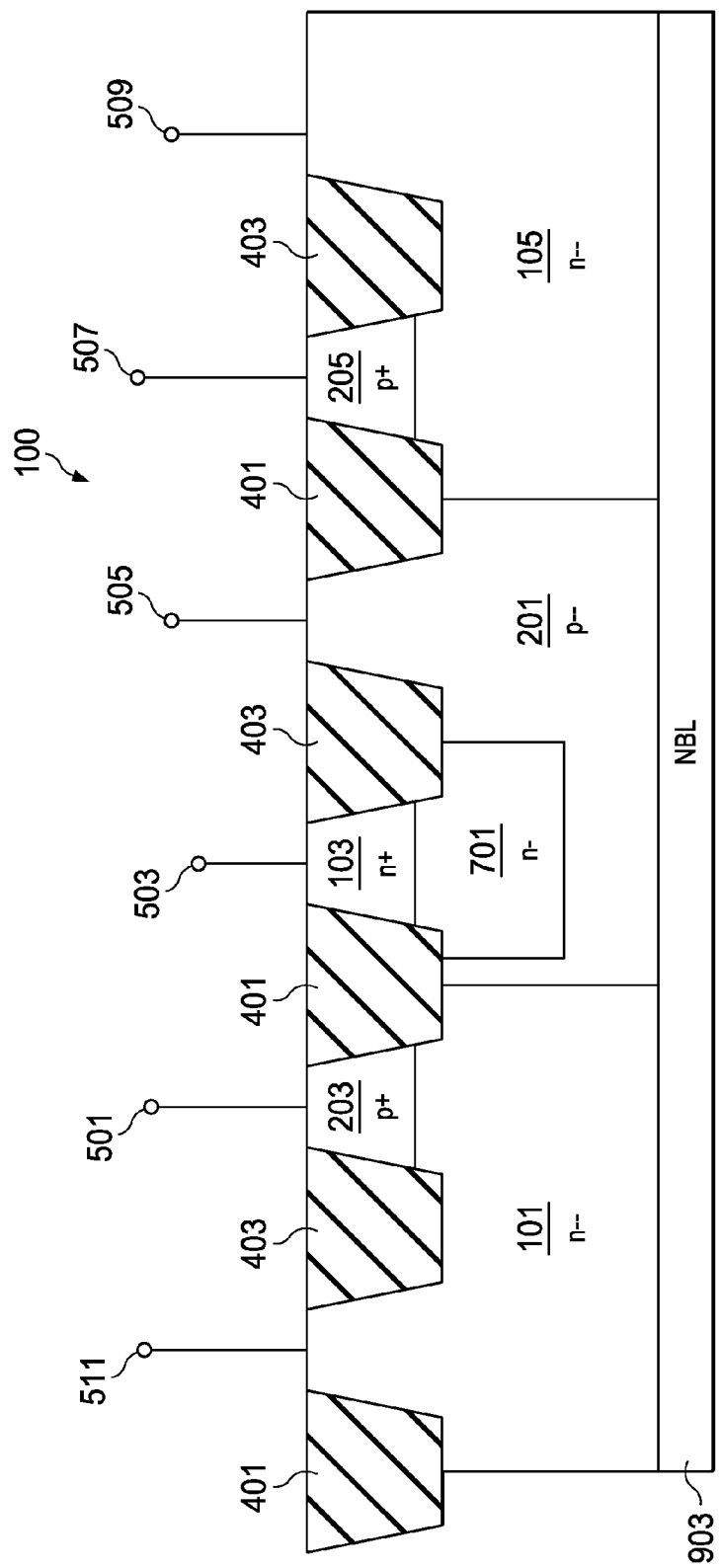
Figure 6C:
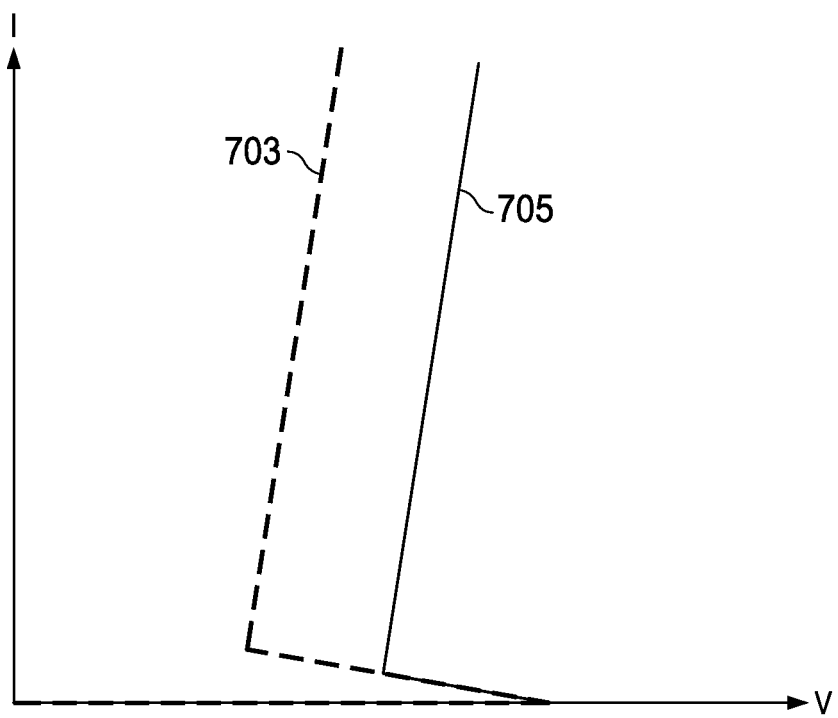
FIGS. 6(c) and 7(d) show various curves illustrating increases in a holding voltage of the ESD protection circuits shown in FIGS. 6(a), 6(b), 7(a), 7(b), and 7(c).

FIG. 6(*a*) shows an embodiment of the ESD protection circuit 100 including the first region 101, the third region 105, the fourth region 203, the fifth region 103, and the sixth region 205. The embodiment shown in FIG. 6(*a*) further includes the second region 201 having multiple parts, e.g. the first part 2011, the second part 2013 and the third part 2015. However, the lateral extent of the third part 2015 of the second region 201 in the embodiment of FIG. 6(*a*) is smaller than the lateral extent of the third part 2015 of the second region 201 shown in FIG. 3(*b*). As shown in FIG. 6(*a*), the third part 2015 of the second region 201 is disposed below the second part 2013 of the second region 201. Furthermore, a first boundary (e.g. a left boundary) and a second boundary (e.g. a right boundary) of the third part 2015 may be disposed below isolation areas (e.g. below the second one of the plurality of second isolation areas 403 and below the second one of the plurality of first isolation areas 403). The second boundary of the third part 2015 may be spaced apart from the boundary between the second region 201 and the third region 105, as shown in FIG. 6(*a*).

The ESD protection circuit 100 shown in FIG. 6(*a*) may further include a seventh region 701 disposed within a portion of the second region 201. For example, the seventh region may be disposed laterally adjacent to the third part 2015 of the second region 201 and below the fifth region 103. The seventh region 701 may include, or may consist of, a fourth n type material. In the embodiment shown in FIG. 6(*a*), the material of the seventh region 701 is shown as an n− type material. However, it is understood that any other n type material may be used. For example, the seventh region 701 may include, or may consist of, an n−−type, n type, n+ type, or n++ type material. These embodiments are not shown for the sake of simplicity and brevity.

A first boundary (e.g. a left boundary) and a second boundary (e.g. a right boundary) of the seventh region 701 may be disposed below isolation areas (e.g. below the first one of the plurality of first isolation areas 401 and below the second one of the plurality of second isolation areas 403). The first boundary of the seventh region 701 may be spaced apart from the boundary between the second region 201 and the first region 101, as shown in FIG. 6(*a*).

The holding voltage of the ESD protection circuit 100 shown in FIG. 6(*a*) is higher than the holding voltage of the ESD protection circuit 100 shown in FIG. 1(*a*). This increase in the holding voltage may be attributed to a change in the composition of the second N node of the ESD protection circuit 100. For example, in FIG. 1(*a*), the second N node of the ESD protection circuit 100 includes one n type material (e.g. the material of the fifth region 103, e.g. n+ type material). However, in FIG. 6(*a*), the second N node of the ESD protection circuit 100 includes more than one n type material, e.g. the material of the fifth region 103 (e.g. n+ type material) and the material of the seventh region 701 (e.g. n− type material). This change in the composition of the second N node of the ESD protection circuit 100 can affect (e.g. increase) the current gain of SCR circuit and, thus, boost the holding voltage of the ESD protection circuit 100. The higher holding voltage of the ESD protection circuit 100 reduces the gap between a trigger voltage of the ESD protection circuit 100 and the holding voltage of the ESD protection circuit 100. Consequently, the ESD protection circuit 100 may not remain active even when an IC to which it is connected is no longer under ESD stress.

Various embodiments of the first region 101, the second region 201, and the third region 105 may be combined together to provide other embodiments of the ESD protection circuit 100. For example, in the embodiment of FIG. 6(*b*), the second region 201 includes only one part (akin to the embodiment of the second region 201 in FIG. 1(*a*)), and the seventh region 701 may be disposed in a portion of the second region 201. For example, the seventh region 701 is disposed below the fifth region 103 and is partially surrounded by the second region 201.

FIG. 6(*c*) shows a graph illustrating the holding voltages of the ESD protection circuits 100 shown in FIG. 1(*a*) to FIG. 5 and the ESD protection circuit 100 shown in FIGS. 6(*a*)-6(*b*) having the seventh region 701. The curve 703 may be identified as the holding voltage of the ESD protection circuits 100 shown in FIG. 1(*a*) to FIG. 5. The curve 705 may be identified as the holding voltage of the ESD protection circuit 100 shown in FIGS. 6(*a*)-6(*b*) having the seventh region 701. As shown in FIG. 6(*c*), the holding voltage 705 is larger than the holding voltage 703. Inclusion of the seventh region 701 in the ESD protection circuit 100 may boost or increase the holding voltage of the SCR circuit 200 by about 5 Volts to about 10 Volts.

FIG. 7(*a*) shows an embodiment of the ESD protection circuit 100 including the first region 101, the second region 201 (having the first part 2011, the second part 2013, and the third part 2015 of smaller lateral extent), the third region 105, the fourth region 203, the fifth region 103, the sixth region 206, and the seventh region 701. However, in the embodiment of FIG. 7(*a*), the fifth region 103 includes, or consists of, a fourth p type material (instead of the third n type material, as shown in the embodiments of FIG. 1(*a*) to FIG. 5). In the embodiment shown in FIG. 7(*a*), the material of the fifth region 103 is shown as a p+ type material. However, it is understood that any other p type material may be used. For example, the fifth region 103 may include, or may consist of, a p−− type, p− type, p type, or p++ type material. These embodiments are not shown for the sake of simplicity and brevity.

Figure 7A:
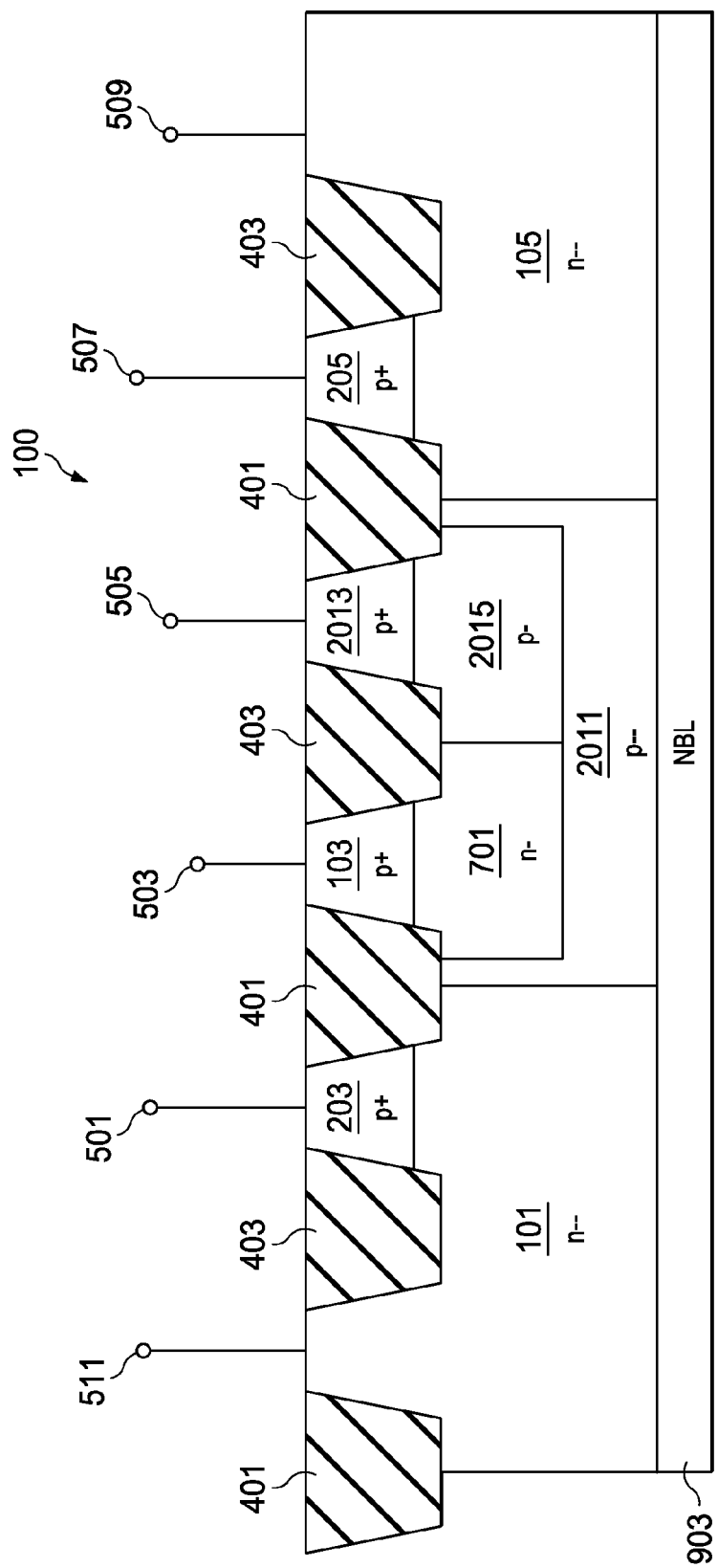
Figure 7B:
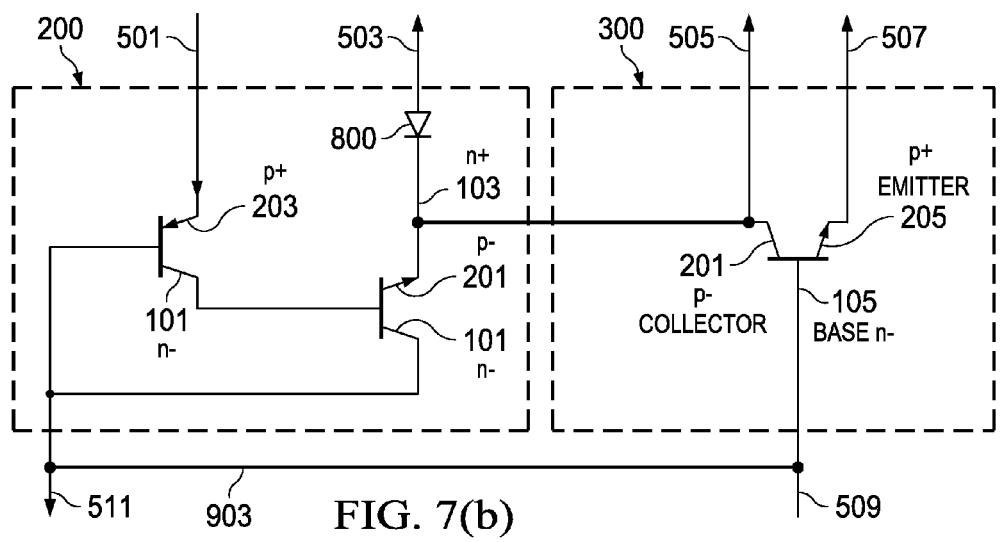
Figure 7C:
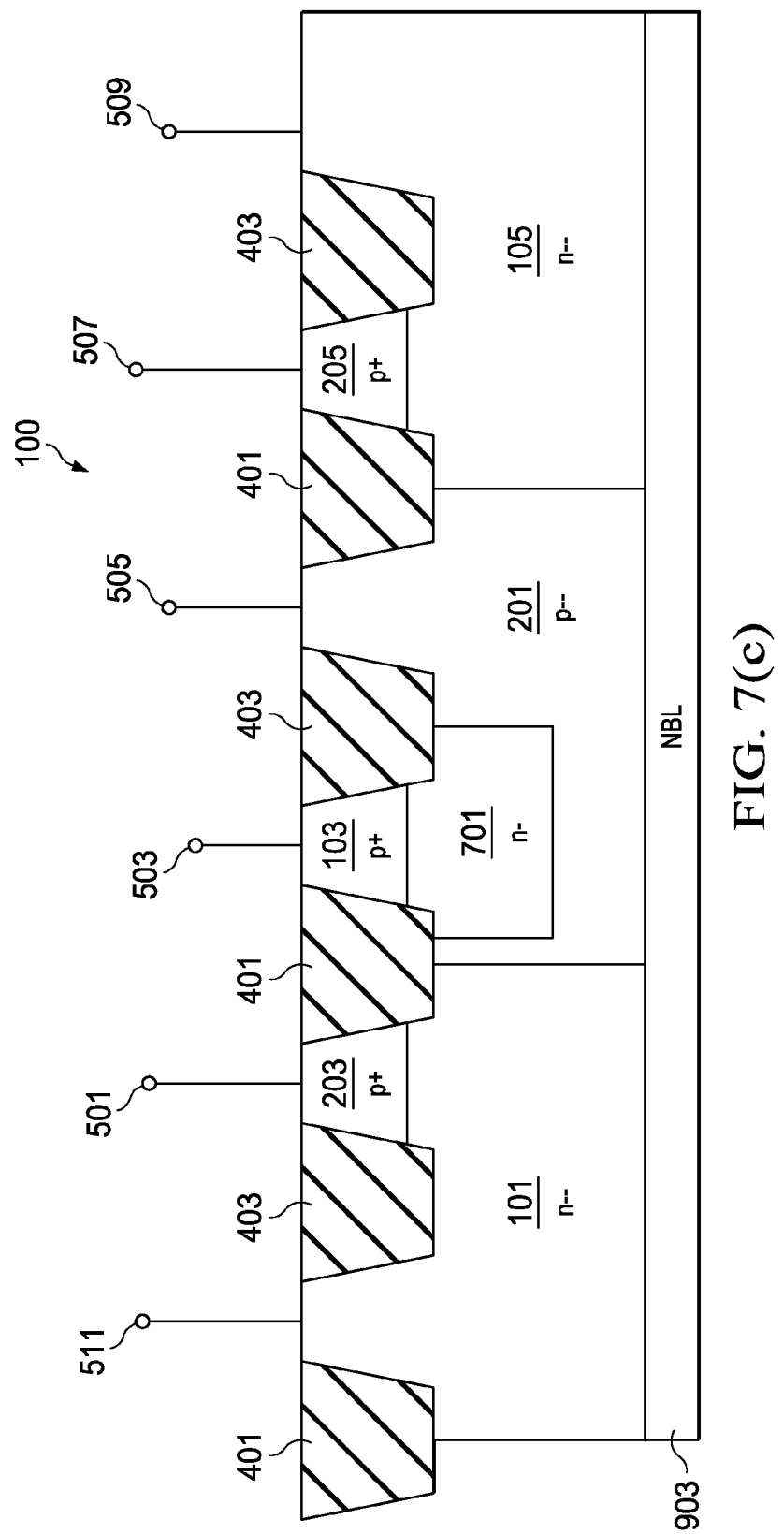

As shown in FIG. 7(a), the fifth part 103 (including, or consisting of, a p type material) may be in contact (e.g. in direct physical contact) with the seventh region 701. Since the seventh region 701 and the fifth part 103 shown in FIG. 7(a) include, or consist of, materials of different conductivity types, the common boundary of the seventh region 701 and the fifth part 102 forms a p-n junction which may be identified as an embedded PN diode 800 shown in FIG. 7(b) in a circuit schematic diagram. The p type material of the fifth region 103 and the n type material of the seventh region 701 creates a barrier potential for the embedded PN diode 800, which shifts a holding voltage for the ESD protection circuit 100 upwards from a holding voltage of the SCR circuit 200 alone. As a result, the holding voltage of the ESD protection circuit 100 shown in FIG. 7(a) and FIG. 7(b) is substantially equal to a sum of the holding voltage of the SCR circuit 200, the barrier potential of the p-n junction formed by the seventh region 701 and the third part 2015 of the second region 201, and a block voltage of the embedded PN diode 800. Accordingly, the holding voltage of the ESD protection circuit 100 shown in FIG. 7(a) and FIG. 7(b) may be higher than the holding voltage of the ESD protection circuit 100 shown in FIG. 6(a). The higher holding voltage of the ESD protection circuit 100 reduces the gap between a trigger voltage of the ESD protection circuit 100 and the holding voltage of the ESD protection circuit 100. Consequently, the ESD protection circuit 100 may not remain active even when an IC to which it is connected is no longer under ESD stress.

Various embodiments of the first region 101, the second region 201, and the third region 105 may be combined together to provide other embodiments of the ESD protection circuit 100. For example, in the embodiment of FIG. 7(c), the second region 201 includes only one part, and the seventh region 701 may be disposed in a portion of the second region 201. For example, the seventh region 701 is disposed below the fifth region 103 (including, or consisting of, the p type material) and is partially surrounded by the second region 201.

Figure 7D:
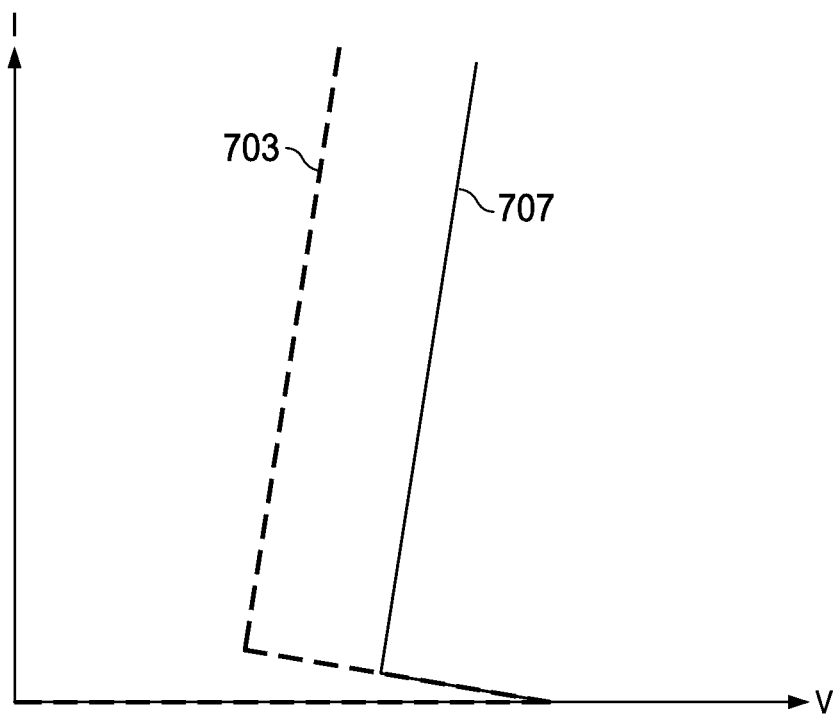

FIG. 7(d) shows a graph illustrating the holding voltages of the ESD protection circuits 100 shown in FIG. 1(a) to FIG. 5 and the ESD protection circuit 100 shown in FIGS. 7(a) and 7(b). The curve 703 may be identified as the holding voltage of the ESD protection circuits 100 shown in FIG. 1(a) to FIG. 5. The curve 707 may be identified as the holding voltage of the ESD protection circuit 100 shown in FIG. 7(a) and FIG. 7(b). As shown in FIG. 7(d), the holding voltage 707 is larger than the holding voltage 703. Inclusion of the fifth region 103 including, or consisting of, the n type material in the ESD protection circuit 100 may boost or increase the holding voltage of the SCR circuit 200 by about 8 Volts to about 20 Volts, as an example.

Figure 8:
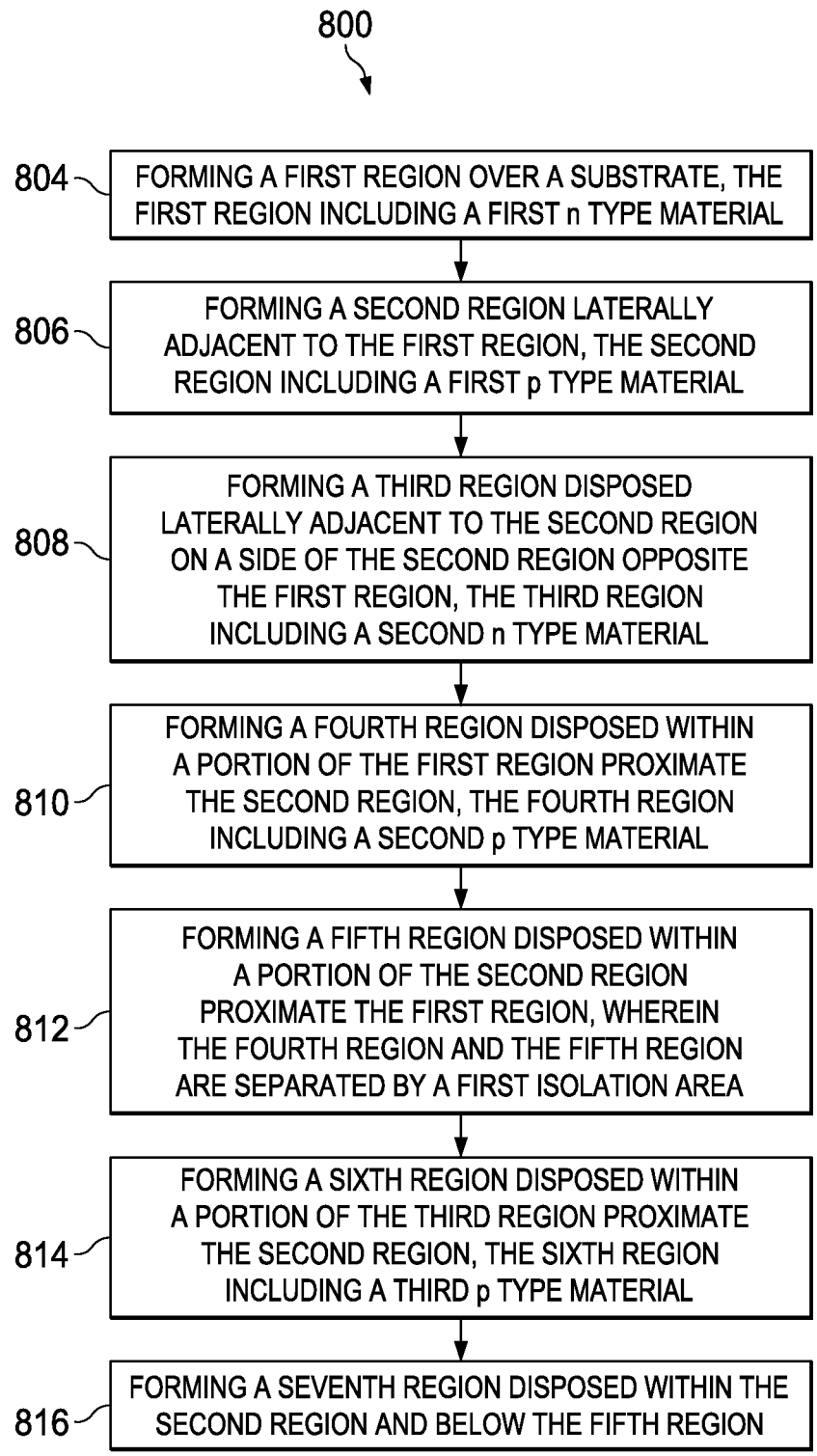
FIG. 8 shows a method of manufacturing a semiconductor device, in accordance with some embodiments.

FIG. 8 shows a method 800 of manufacturing a semiconductor device. The method 800 may, for example, be used to manufacture the ESD protection circuits 100 shown in FIG. 1(a) to FIG. 7(b). The method 800 may include: forming a first region over a substrate, the first region including a first n type material (in 804); forming a second region laterally adjacent to the first region, the second region including a first p type material (in 806); forming a third region disposed laterally adjacent to the second region on a side of the second region opposite the first region, the third region including a second n type material (in 808); forming a fourth region disposed within a portion of the first region proximate the second region, the fourth region including a second p type material (in 810); forming a fifth region disposed within a portion of the second region proximate the first region, wherein the fourth region and the fifth region are separated by a first isolation area (in 812); forming a sixth region disposed within a portion of the third region proximate the second region, the sixth region including a third p type material (in 814); and forming a seventh region disposed within the second region and below the fifth region (in 816). While the method 800 has been described in the sequence presented in FIG. 8, it should be noted that another sequence of steps may be used to manufacture at least one of the ESD protection circuits 100 shown in FIG. 1(a) to FIG. 7. Furthermore, some of the steps shown in the method 800 may be performed simultaneously. For example, a region may be formed simultaneously with at least one other region. Accordingly, the method 800 should not be limited to the sequence of steps shown in FIG. 8.

According to various embodiments presented herein, a semiconductor device may be provided. The semiconductor device may include: a substrate; a first region over the substrate, the first region including a first n type material; a second region laterally adjacent to the first region, the second region including a first p type material; a third region disposed laterally adjacent to the second region on a side of the second region opposite the first region, the third region including a second n type material; a fourth region disposed within a portion of the first region proximate the second region, the fourth region including a second p type material; a fifth region disposed within a portion of the second region proximate the first region, wherein the fourth region and the fifth region are separated by a first isolation area; a sixth region disposed within a portion of the third region proximate the second region, the sixth region including a third p type material; and a seventh region disposed within the second region and below the fifth region.

According to various embodiments presented herein, a semiconductor device may be provided. The semiconductor device may include: a substrate; an n type buried layer (NBL) over the substrate; a first region over the NBL, the first region including a first n type material; a second region, including a first p type material, laterally adjacent to the first region, the second region including a first part and a second part, wherein the first part is laterally adjacent to the first region, and wherein the second part is disposed over the first part in a portion of the second region opposite the first region; a third region disposed laterally adjacent to the second region on a side of the second region opposite the first region, the third region including a second n type material; a fourth region disposed within a portion of the first region proximate the second region, the fourth region including a second p type material; a fifth region disposed within a portion of the second region proximate the first region, wherein the fourth region and the fifth region are separated by a first isolation area; a sixth region disposed within a portion of the third region proximate the second region, the sixth region including a third p type material; and a seventh region disposed within the second region and below the fifth region, wherein the seventh region is partially surrounded by the first part of the second region and in physical contact with the fifth region and the first part of the second region.

According to various embodiments presented herein, a method for manufacturing a semiconductor device may be provided. The method may include: forming a first region over a substrate, the first region including a first n type material; forming a second region laterally adjacent to the first region, the second region including a first p type material; forming a third region disposed laterally adjacent to the second region on a side of the second region opposite the first region, the third region including a second n type material; forming a fourth region disposed within a portion of the first region proximate the second region, the fourth region including a second p type material; forming a fifth region disposed within a portion of the second region proximate the first region, wherein the fourth region and the fifth region are separated by a first isolation area; forming a sixth region disposed within a portion of the third region proximate the second region, the sixth region including a third p type material; and forming a seventh region disposed within the second region and below the fifth region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
a first region over the substrate, the first region comprising a first n type material;
a second region laterally adjacent to the first region, the second region comprising a first p type material;
a third region disposed laterally adjacent to the second region on a side of the second region opposite the first region, the third region comprising a second n type material;
a fourth region disposed within a portion of the first region proximate the second region, the fourth region comprising a second p type material;
a fifth region disposed within a portion of the second region proximate the first region, wherein the fourth region and the fifth region are separated by a first isolation area;
a sixth region disposed within a portion of the third region proximate the second region, the sixth region comprising a third p type material; and
a seventh region disposed within the second region and below the fifth region.

2. The semiconductor device of claim 1, further comprising an n type buried layer over the substrate and below the first region, the second region, and the third region.

3. The semiconductor device of claim 1, wherein the fifth region comprises a third n type material.

4. The semiconductor device of claim 1, wherein the fifth region comprises a fourth p type material.

5. The semiconductor device of claim 1, further comprising a second isolation area disposed laterally adjacent to the fourth region on a side of the fourth region opposite the first isolation area.

6. The semiconductor device of claim 1, wherein the fourth region and the fifth region are spaced apart from a boundary between the first region and the second region.

7. The semiconductor device of claim 1, wherein the seventh region is spaced apart from a boundary between the first region and the second region.

8. The semiconductor device of claim 1, wherein the sixth region is spaced apart from a boundary between the second region and the third region.

9. The semiconductor device of claim 1, wherein the second region comprises a first part and a second part, wherein the first part is laterally adjacent to the first region and surrounds a portion of the seventh region, wherein the second part is laterally adjacent to the fifth region.

10. The semiconductor device of claim 9, wherein the fifth region and the second part of the second region are separated by a third isolation area.

11. The semiconductor device of claim 9, wherein the second region further comprises a third part laterally adjacent to the seventh region and below the second part of the second region, wherein the seventh region is in physical contact with the third part of the second region.

12. A semiconductor device comprising:
a substrate;
an n type buried layer (NBL) over the substrate;
a first region over the NBL, the first region comprising a first n type material;
a second region, comprising a first p type material, laterally adjacent to the first region, the second region comprising a first part and a second part, wherein the first part is laterally adjacent to the first region, and wherein the second part is disposed over the first part in a portion of the second region opposite the first region;
a third region disposed laterally adjacent to the second region on a side of the second region opposite the first region, the third region comprising a second n type material;
a fourth region disposed within a portion of the first region proximate the second region, the fourth region comprising a second p type material;
a fifth region disposed within a portion of the second region proximate the first region, wherein the fourth region and the fifth region are separated by a first isolation area;
a sixth region disposed within a portion of the third region proximate the second region, the sixth region comprising a third p type material; and
a seventh region disposed within the second region and below the fifth region, wherein the seventh region is partially surrounded by the first part of the second region and in physical contact with the fifth region and the first part of the second region.

13. The semiconductor device of claim 12, wherein the fifth region comprises a third n type material.

14. The semiconductor device of claim 12, wherein the fifth region comprises a fourth p type material.

15. The semiconductor device of claim 12, wherein the second region further comprises a third part laterally adjacent to the seventh region and below the second part of the second region, wherein the seventh region is in physical contact with the third part of the second region.

16. The semiconductor device of claim 12, further comprising:
a first contact electrically connected to the first region;
a second contact electrically connected to the fourth region;
a third contact electrically connected to the fifth region;
a fourth contact electrically connected to the second part of the second region;
a fifth contact electrically connected to the sixth region; and
a sixth contact electrically connected to the third region.

17. A semiconductor device comprising:
a first N-region over a substrate, the first N-region having a first concentration of n-type dopants;

a first P-region laterally adjacent to the first N-region, the first P-region having a first concentration of p-type dopants;

a second N-region laterally adjacent to the first P-region on a side of the first P-region opposite the first N-region;

a first P-well within the first N-region, the first P-well having a second concentration of p-type dopants greater than the first concentration of p-type dopants;

a first N-well within the first P-region, the first N-well having a second concentration of n-type dopants greater than the first concentration of n-type dopants;

a second N-well within the first P-region and below the first N-well, the second N-well having a third concentration of n-type dopants greater than the first concentration of n-type dopants and less than the second concentration of n-type dopants;

a second P-well within the first P-region and adjacent to the first N-well, the second P-well having a third concentration of p-type dopants greater than the first concentration of p-type dopants;

a third P-well within the first P-region, below the second P-well, and adjacent to the second N-well, the third P-well having a fourth concentration of p-type dopants greater than the first concentration of p-type dopants and less than the third concentration of p-type dopants; and a fourth P-well within the second N-region, the second P-well having a fifth concentration of p-type dopants greater than the first concentration of p-type dopants.

18. The semiconductor device of claim 17, wherein portions of the first P-region are disposed below and adjacent to sidewalls of the second N-well and the third P-well.

19. The semiconductor device of claim 17, wherein the first P-well and the first N-well are separated by a first isolation area, and wherein the first N-well and the second P-well are separated by a second isolation area.

20. The semiconductor of claim 17, wherein the second N-well is spaced apart from an interface between the first N-region and the first P-region, and wherein the third P-well is spaced apart from an interface between the first P-region and the second N-region.

* * * * *